(12) United States Patent
Yang et al.

(10) Patent No.: US 8,081,477 B2
(45) Date of Patent: Dec. 20, 2011

(54) HEAT SINK ASSEMBLY HAVING A CLIP

(75) Inventors: Jian Yang, Shenzhen (CN); Heng Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 177 days.

(21) Appl. No.: 12/495,675

(22) Filed: Jun. 30, 2009

(65) Prior Publication Data

US 2010/0271784 A1 Oct. 28, 2010

(30) Foreign Application Priority Data

Apr. 27, 2009 (CN) .......................... 2009 1 0301898

(51) Int. Cl.
*H05K 7/20* (2006.01)

(52) U.S. Cl. ........ 361/720; 361/704; 361/707; 361/709; 361/719; 165/80.3; 165/185

(58) Field of Classification Search .......................... None
See application file for complete search history.

(56) References Cited

U.S. PATENT DOCUMENTS

| | | | |
|---|---|---|---|
| 6,510,054 B1* | 1/2003 | Chen | 361/704 |
| 6,822,869 B2* | 11/2004 | Huang et al. | 361/704 |
| 7,203,066 B2* | 4/2007 | Lee et al. | 361/704 |
| 7,382,622 B2* | 6/2008 | Li et al. | 361/719 |
| 2003/0015343 A1* | 1/2003 | Chen | 174/252 |
| 2010/0002396 A1* | 1/2010 | He et al. | 361/709 |

* cited by examiner

*Primary Examiner* — Courtney Smith
(74) *Attorney, Agent, or Firm* — Altis Law Group, Inc.

(57) ABSTRACT

A heat sink assembly includes a heat sink adapted for thermally contacting an electronic component of a printed circuit board, and a clip pressing the heat sink and engaging with the printed circuit board. The clip includes a pressing portion pressing the heat sink, two arms extending slantwise and upwardly from opposite ends of the pressing portion, two connecting portions extending outwardly from the two arms, two securing portions engaging with the printed circuit board, and two operating portions. When the two operating portion are operated, the connecting portions are rotated and the securing portions rotate with the connecting portions to engage with the printed circuit board.

17 Claims, 4 Drawing Sheets

HEAT SINK ASSEMBLY HAVING A CLIP

BACKGROUND

1. Technical Field

The present invention relates to heat sink assemblies and, more particularly, to a heat sink assembly having a clip which can be easily and accurately assembled to the heat sink.

2. Description of Related Art

A heat sink assembly cools an electronic device. The heat sink assembly generally includes a heat sink attached to an outer surface of the electronic device to facilitate dissipation of heat therefrom and a clip fastening the heat sink to the electronic device. The heat sink includes a base and a plurality of fins extending therefrom. A channel is defined between every two adjacent fins. The clip extends through one of the channels of the heat sink and abuts a top surface of the base.

When the clip is mounted on the heat sink, the heat sink is punched by a tool to have a portion thereof deformed to engage with the clip. By this manner, on the one hand, the punched part of the heat sink may be broken from the heat sink during the punching process whereby the clip cannot be attached to the heat sink. On the other hand, the punched part may too tightly engage with the clip, thereby the clip can not properly rotate relative to the heat sink and accordingly cannot properly secure the heat sink to the electronic device.

What is needed, therefore, is a heat sink assembly having a clip which can be easily and accurately assembled to the heat sink to solve the problems of the prior art mentioned above.

DETAILED DESCRIPTION

Figure 1:
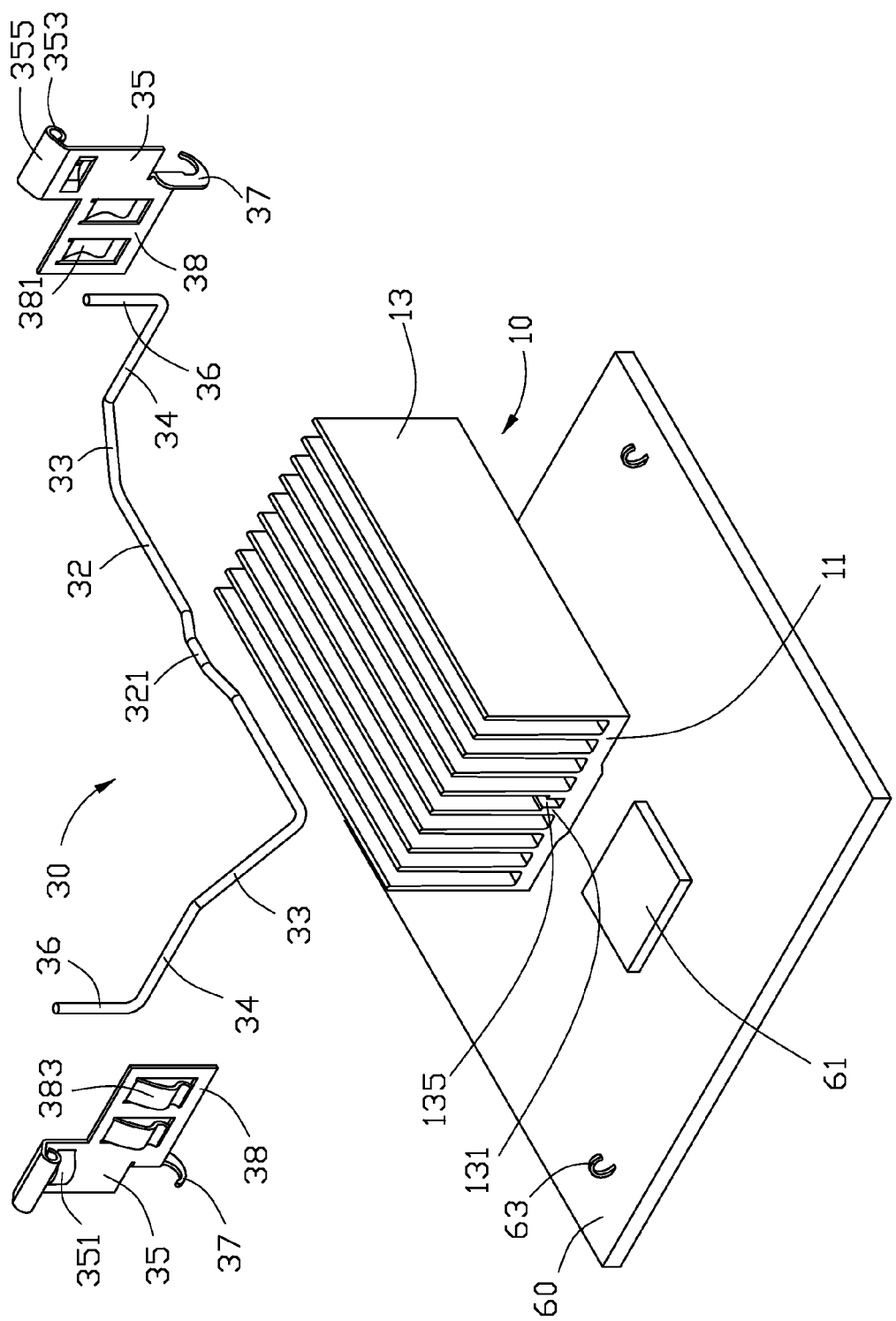
FIG. 1 is an exploded view of a heat sink assembly in accordance with a first embodiment of the present disclosure, and a printed circuit board for mounting the heat sink assembly thereon.
Figure 2:
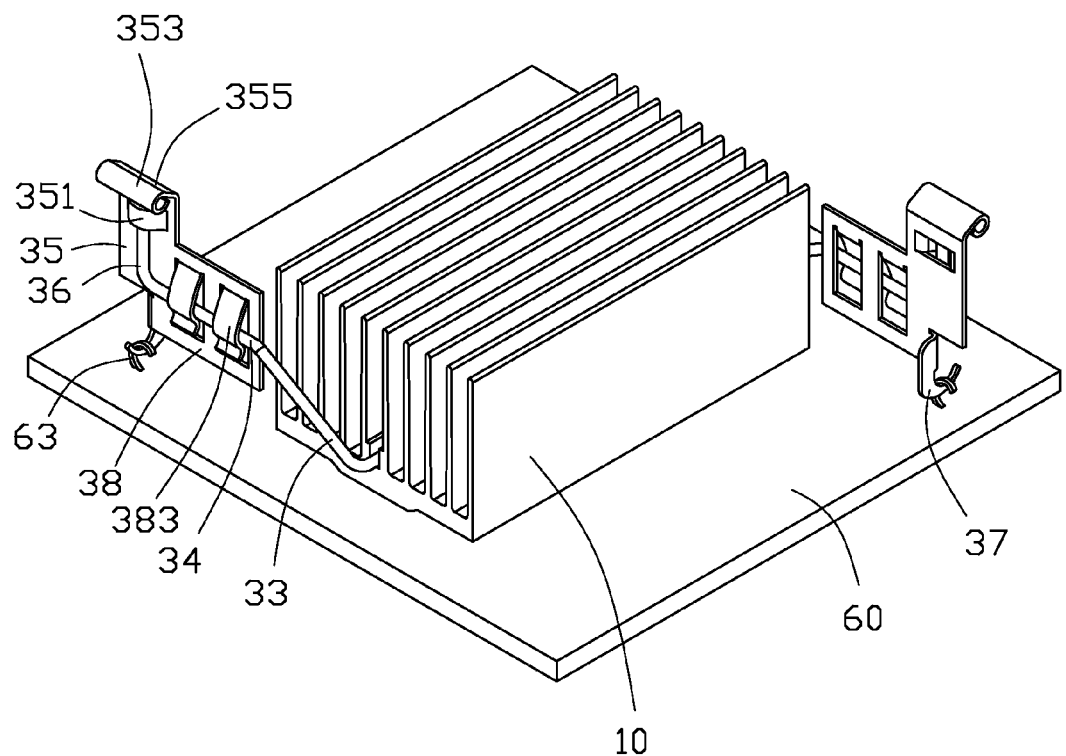
FIG. 2 is an assembled view of the heat sink assembly and the printed circuit board of FIG. 1.

Referring to FIGS. 1-2, a first embodiment of a heat sink assembly comprises a heat sink 10 and a clip 30 engaging with the heat sink 10. The heat sink 10 thermally contacts an electronic component 61 mounted on a printed circuit board (PCB) 60. The clip 30 spans over the heat sink 10 and engages with two hooks 63 located on the PCB 60 and near two diagonal corners of the heat sink 10 to secure the heat sink 10 on the PCB 60.

The heat sink 10 is integrally made of metal with high heat conductivity such as copper, aluminum or an alloy thereof. The heat sink 10 comprises a rectangular base 11 and a plurality of fins 13 extending upwardly from a top surface of the base 11. The fins 13 are parallel to and spaced from each other. Two protrusions 131 extend inwardly from inner surfaces of two of the fins 13 which are located at a center of the heat sink 10. The two protrusions 131 face each other and define a straight groove 135 therebetween to receive the clip 30 therein. The groove 135 is narrower than a gap between top portions of the corresponding fins 13.

The clip 30 comprises a pressing portion 32, two arms 33, two connecting portions 34, two operating portions (not labeled) and two securing portions 37. The pressing portion 32, the arms 33 and the connecting portions 34 are integrally made of a metal wire. The clip 30 is symmetrical about a central portion of the pressing portion 32.

The pressing portion 32 of the clip 30 is snugly received in the groove 135 between the fins 13 of the heat sink 10. A length of the pressing portion 32 approaches that of the groove 135. A center of the pressing portion 32 forms a trapeziform resisting portion 321 abutting against one of the protrusions 131 of the fins 13 of the heat sink 10 to prevent the pressing portion 32 from excessive rotation in the groove 135 when the clip 30 is mounted on the PCB 60. The two arms 33 substantially perpendicularly extend from opposite ends of the pressing portion 32 and are oriented toward opposite directions. The two connecting portions 34 horizontally extend outwardly from free ends of the two arms 33, respectively. The arm 33 and the connecting portion 34 form a V-shaped configuration, with an obtuse angle included therebetween. Two extending portions 36 extend perpendicularly and upwardly from free ends of the two connecting portions 34, respectively. Two first engaging portions 35 engage with the two extending portions 36 to form the two operating portions, respectively. The securing portion 37 is a clasp and connects the operating portion. The operating portions are provided for facilitating a user to exert a force to rotate the two connecting portions 34 and the securing portions 37.

Each of the first engaging portions 35 is a rectangular metallic sheet. A receiving tube 351 is formed on a top portion of the first engaging portion 35 to receive the extending portion 36 therein. An operating plate 355 extends slantwise and upwardly from a top end of the first engaging portion 35. The operating plate 355 and the receiving tube 351 are oriented toward the same direction. A barrel-shaped baffling portion 353 curves outwardly and downwards from a top end of the operating plate 355 and is located at a top of the receiving tube 351 to baffle the extending portion 36 of the clip 30 from extending upwardly beyond a top edge of the first engaging portion 35. The extending portion 36 extends through the receiving tube 351 and abuts against the baffling portion 353. Thus, the operating portion is formed.

A second engaging portion 38 horizontally extends from a lower portion of a right end of the first engaging portion 35. The second engaging portion 38 is a rectangular metal sheet and is integrally formed with the first engaging portion 35. A top portion of a left end of the second engaging portion 38 connects with the lower portion of the right end of the first engaging portion 35, and a lower portion of the left end of the second engaging portion 38 extends downwardly beyond a bottom end of the first engaging portion 35. Two spaced openings 381 are defined at a central portion of the second engaging portion 38. Two elastic, bended pressing plates 383 extend downwardly from the second engaging portion 38 defining top edges of the two openings 381, respectively and cover the two openings 381. Each pressing plate 383 has a free end apart from the second engaging portion 38, whereby the pressing plates 383 and the second engaging portion 38 form a passage therebetween, allowing the connecting portion 34 of the clip 30 to extend therethrough. The two pressing plates 383 are located below the receiving tube 351 of the first engaging portion 35 and press the connecting portion 34 of the clip 30 against the second engaging portion 38. The securing portion 37 is an L-shaped clasp and extends downwardly from the left end of the second engaging portion 38. The securing portion 37 extends downwardly beyond the bottom end of the second engaging portion 38 and oriented towards the same direction of the operating plate 355 of the first engaging portion 35. The securing portions 37 engage with the hooks 63 of the PCB 60 to secure the heat sink 10 on the PCB 60.

In assembly, the heat sink is disposed on a top surface of the electronic component 61 of the PCB 60. The extending portion 36 of the clip 30 extends upwardly through the receiving tube 351 and abuts against the baffling portion 353 of the first engaging portion 35. The connecting portion 34 of the clip 30 is rotated and pressed into the passage between the pressing plates 383 of the second engaging portion 38. The clip 30 is arranged on the top surface of the base 11 from top to bottom of the fins 13. Thus, the pressing portion 32 of the clip 30 extends through the fins 13 and is received in the groove 135 of the heat sink 10. The resisting portion 321 of the pressing portion 32 abuts against one of the protrusions 131 of the fins 13 of the heat sink 10 to prevent the pressing portion 32 from excessive rotation in the groove 135. The two arms 33 are located at opposite sides of the heat sink 10 and oriented toward opposite directions. The operating plate 355 of the second engaging portion 35 subjects to an external force which is perpendicular to the operating plate 355. The external force pushes the extending portion 36, the connecting portion 34, the arm 33 and the securing portion 37 downwardly. The connecting portion 34 is rotated relative to the second engaging portion 38, and the securing portion 37 is rotated with the rotation of the connecting portion 34, until the securing portion 37 engages with the corresponding hook 63 of the PCB 60. The external force is released, the securing portion 37 clasps the hook 63 and due to the resilience of the arm 33 and the connecting portion 34, the securing portion 37 is pulled upwardly to tightly engage with the hook 63. Thus, the heat sink assembly and the PCB 60 are assembled together.

In this present disclosure, a torsion occurring at joints of the connecting portion and the arm and the connecting portion and the extending portion is decreased due to the connecting portion 34 can rotate relative to the second engaging portion 38 when the operating plate 355 is pressed. An elastic deformation of the extending portion 36 and connecting portion 34 is decreased because the extending portion 36 and the connecting portion 34 are mounted on the first and second engaging portions 35, 38 respectively. A vertical distance of the arm 33 moved relative to the base 11 of the heat sink 10 is decreased due to the securing portion 37 rotating with the connecting portion 34. Thus, a stability of the clip 30 is improved.

Figure 3:
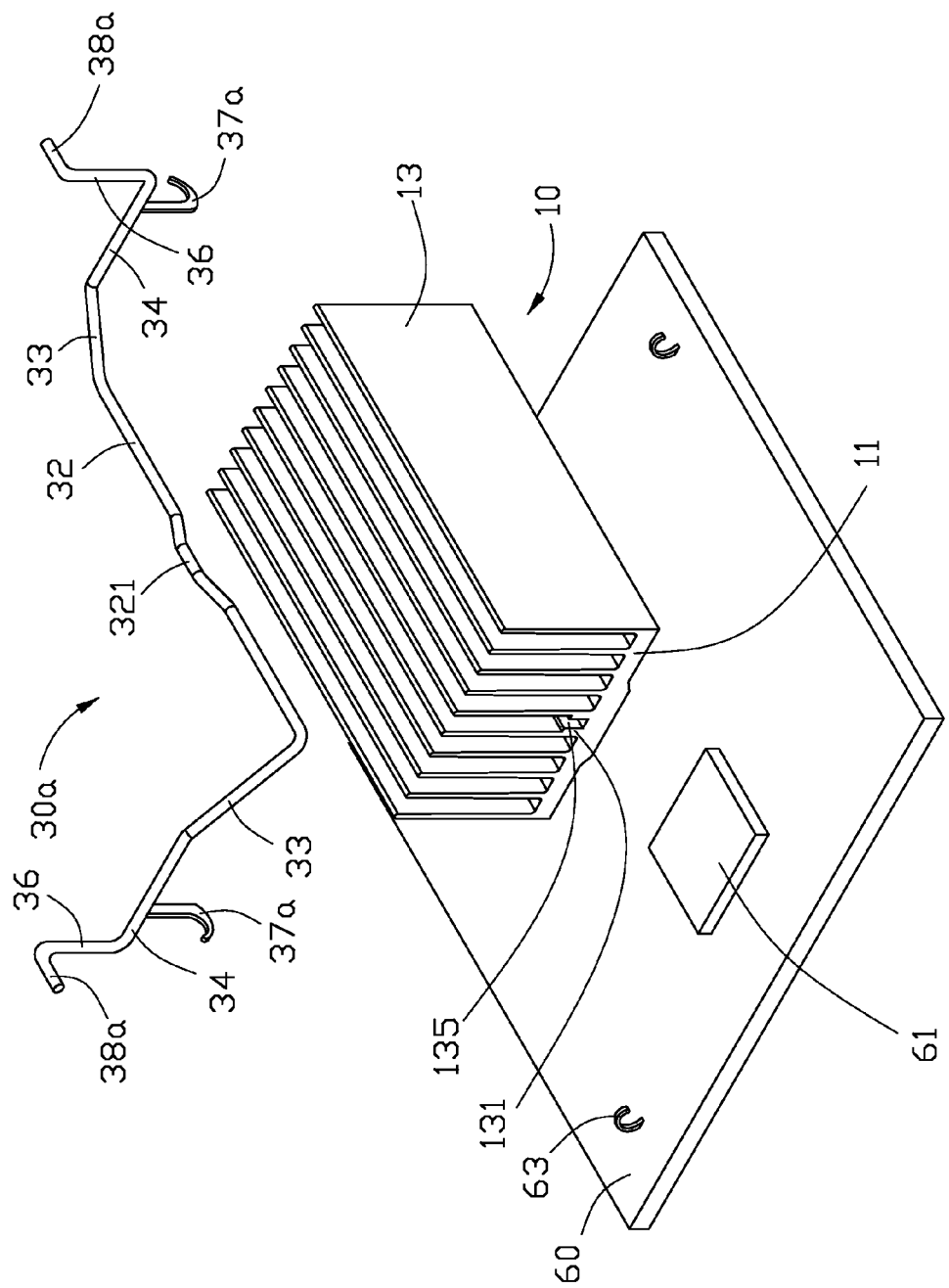
FIG. 3 is an exploded view of a heat sink assembly in accordance with a second embodiment of the present disclosure, and a printed circuit board for mounting the heat sink assembly thereon.

Referring to FIG. 3, a second embodiment of a heat sink assembly is similar to the heat sink assembly of the first embodiment. The heat sink assembly of the second embodiment comprises a heat sink 10 and a clip 30a. The clip 30a is similar to the clip 30 of the first embodiment. One difference between the clips 30a, 30 is that a securing portion 37a is formed on the connecting portion 34 and extends downwardly from the connecting portion 34, and a straight handle 38a extends frontward from a top end of the extending portion 36. The handle 38a and the securing portion 37a are oriented toward the same direction. The handle 38a and the extending portion 36 form an L-shaped configuration operating portion. The handle 38a is operated to make the securing portion 37a and the connecting portion 34 rotate relative to the hook 63 of the PCB 60, until the securing portion 37a engages with the hook 63. Thus, the heat sink 10 is assembled on the PCB 60 via the clip 30a.

Figure 4:
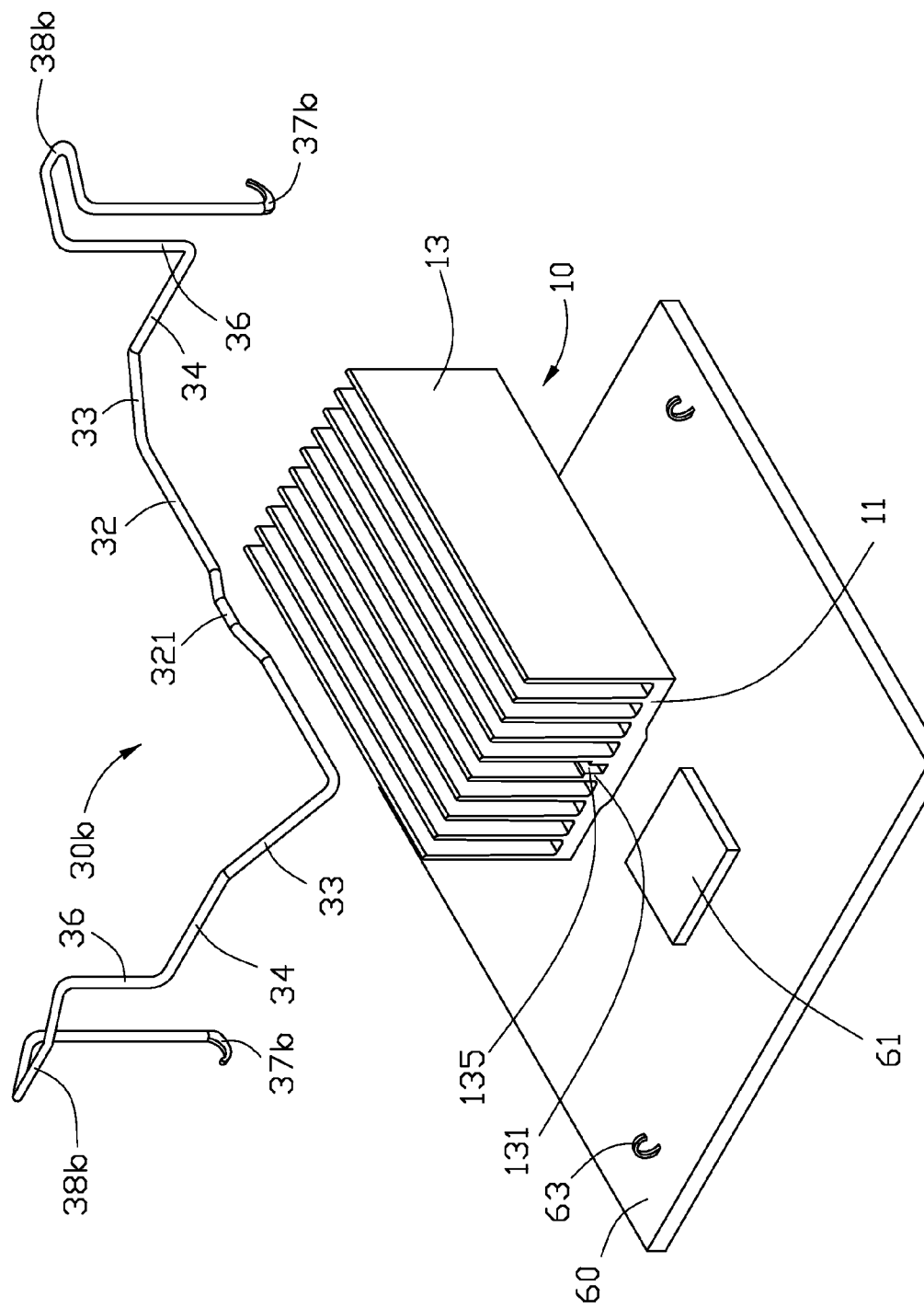
FIG. 4 is an exploded view of a heat sink assembly in accordance with a third embodiment of the present disclosure, and a printed circuit board for mounting the heat sink assembly thereon.

Referring to FIG. 4, a heat sink assembly of a third embodiment is similar to the heat sink assembly of the first embodiment. The heat sink assembly of the third embodiment comprises a heat sink 10 and a clip 30b. The clip 30b is similar to the clip 30 of the first embodiment. Difference between the clips 30b, 30 is that a U-shaped handle 38b is integrally formed at the top end of the extending portion 36 and a securing portion 37b extends downwardly from the handle 38b. Two opposite ends of the handle 38b connect the securing portion 37b and the extending portion 36, respectively. The handle 38b and the extending portion 36 form an operating portion. The handle 38b and the securing portion 37b are oriented toward the same direction. The handle 38b is operated to make the securing portion 37b rotate relative to the hook 63 of the PCB 60, until the securing portion 37b engages with the hook 63. Thus, the heat sink 10 is assembled on the PCB 60 via the clip 30b.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A clip adapted for securing a heat sink on a printed circuit board, the clip comprising:
    a pressing portion for pressing the heat sink;
    two arms extending slantwise from opposite ends of the pressing portion;
    two connecting portions extending outwardly from two free ends of the two arms, respectively;
    two securing portions for engaging with the printed circuit board; and
    two operating portions connecting the two connecting portions;
    wherein when the two operating portions are operated, the connecting portions are rotated and the securing portions rotate with the connecting portions to engage with the printed circuit board;
    wherein each operating portion comprises an extending portion integrally extending upwardly from an end of the corresponding connecting portion, and a first engaging portion engaging with the extending portion; and
    wherein a receiving tube is formed on a top portion of the first engaging portion and the extending portion extends through the receiving tube.

2. The clip as claimed in claim 1, wherein the pressing portion, the arms, and the connecting portions are integrally formed by a metal wire.

3. The clip as claimed in claim 1, wherein the securing portion extends downwardly from a side of the first engaging portion.

4. The clip as claimed in claim 1, wherein an operating plate extends slantwise and upwardly from a top end of the first engaging portion to be operated.

5. The clip as claimed in claim 4, wherein the operating plate and the securing portion are oriented toward the same direction.

6. The clip as claimed in claim 4, wherein a baffling portion extends frontward from the operating plate and abuts against the extending portion.

7. The clip as claimed in claim 6, wherein a second engaging portion horizontally extends from a side of the first engaging portion, and the second engaging portion abuts against the connecting portion of the clip.

8. The clip as claimed in claim 7, wherein an elastic pressing plate is formed on the second engaging portion, and the connecting portion of the clip is sandwiched between the pressing plate and the second engaging portion and rotates relative to the second engaging portion.

9. The clip as claimed in claim 1, wherein each arm and the corresponding connecting portion form a V-shaped configuration with an obtuse angle.

10. The clip as claimed in claim 1, wherein the clip is radially symmetrical about a central portion of the pressing portion.

11. A heat sink assembly comprising:
   a heat sink for thermally contacting an electronic component of a printed circuit board; and
   a clip engaging with the heat sink, the clip comprising:
      a pressing portion located on and for pressing the heat sink;
      two arms extending slantwise and upwardly from opposite ends of the pressing portion;
      two connecting portions extending outwardly from two free ends of the two arms, respectively;
      two securing portions for engaging with the printed circuit board; and
      two operating portions connecting the two connecting portions;
   wherein when the two operating portions are operated, the connecting portions are rotated and the securing portions rotate with the connecting portions to engage with the printed circuit board;
   wherein each operating portion comprises an extending portion integrally extending upwardly from an end of the corresponding connecting portion and a first engaging portion engaging with the extending portion, and a respective one of the securing portions extends downwardly from a side of the first engaging portion; and
   wherein a receiving tube is formed on a top portion of the first engaging portion and the extending portion extends through the receiving tube.

12. The heat sink assembly as claimed in claim 11, wherein an operating plate extends slantwise and upwardly from a top end of the first engaging portion to be operated, and a baffling portion extends frontward from the operating plate and abuts against the extending portion.

13. The heat sink assembly as claimed in claim 12, wherein a second engaging portion horizontally extends from a side of the first engaging portion, and an elastic pressing plate is formed on the second engaging portion and presses the corresponding connecting portion of the clip.

14. A clip adapted for securing a heat sink on a printed circuit board, the clip comprising:
   a pressing portion for pressing the heat sink;
   two arms extending slantwise from opposite ends of the pressing portion;
   two connecting portions extending outwardly from two free ends of the two arms, respectively;
   two securing portions for engaging with the printed circuit board; and
   two operating portions connecting the two connecting portions;
   wherein when the two operating portions are operated, the connecting portions are rotated and the securing portions rotate with the connecting portions to engage with the printed circuit board;
   wherein each of the arms and the corresponding connecting portion form a V-shaped configuration having an obtuse angle; and
   wherein each operating portion comprises an extending portion integrally extending upwardly from an end of the corresponding connecting portion and a handle integrally extending frontward from an end of the extending portion, the handle is U-shaped, and opposite ends of the handle connect the extending portion and a corresponding one of the securing portions, respectively.

15. The clip as claimed in claim 14, wherein the corresponding securing portion is a clasp that integrally extends downwardly from the handle, the clasp has a hook at an end thereof, and the handle and the hook are oriented toward the same direction.

16. The clip as claimed in claim 14, wherein the pressing portion, the arms, and the connecting portions are integrally formed by a metal wire.

17. The clip as claimed in claim 14, wherein each operating portion comprises a handle integrally extending frontward from an end of the extending portion, the handle is straight, each securing portion is a clasp extending downwardly from the connecting portion, the clasp has a hook at an end thereof, and the handle and the hook are oriented toward the same direction.

* * * * *